(12) United States Patent
Chuang et al.

(10) Patent No.: US 8,295,050 B2
(45) Date of Patent: Oct. 23, 2012

(54) DUAL CPU AND HEAT DISSIPATING STRUCTURE THEREOF

(75) Inventors: Hui-Hsuan Chuang, Shulin (TW); Chia-Ming Cheng, Shulin (TW)

(73) Assignee: Portwell Inc., Shunlin, Taipei County (TW)

( * ) Notice: Subject to any disclaimer, the term of this patent is extended or adjusted under 35 U.S.C. 154(b) by 83 days.

(21) Appl. No.: 12/940,611

(22) Filed: Nov. 5, 2010

(65) Prior Publication Data
US 2012/0113587 A1   May 10, 2012

(51) Int. Cl.
*H05K 7/20* (2006.01)
(52) U.S. Cl. .................. 361/719; 361/695; 361/697
(58) Field of Classification Search .......... 361/697, 361/694, 695, 719
See application file for complete search history.

(56) References Cited

U.S. PATENT DOCUMENTS

| | | | | |
|---|---|---|---|---|
| 5,285,347 A * | 2/1994 | Fox et al. | ...... | 361/699 |
| 6,888,725 B2 * | 5/2005 | Kubo et al. | ...... | 361/719 |
| 7,106,586 B2 * | 9/2006 | Yu et al. | ...... | 361/690 |
| 7,269,014 B1 * | 9/2007 | Zhao et al. | ...... | 361/700 |
| 2002/0134531 A1 * | 9/2002 | Yanagida | ...... | 165/80.3 |
| 2004/0188063 A1 * | 9/2004 | Chang | ...... | 165/80.3 |
| 2005/0286233 A1 * | 12/2005 | Lin et al. | ...... | 361/719 |
| 2006/0238979 A1 * | 10/2006 | Liu | ...... | 361/699 |
| 2007/0115632 A1 * | 5/2007 | Chen et al. | ...... | 361/695 |
| 2011/0141686 A1 * | 6/2011 | Liu | ...... | 361/679.47 |

* cited by examiner

*Primary Examiner* — Gregory Thompson
(74) *Attorney, Agent, or Firm* — Muncy, Geissler, Olds & Lowe, PLLC

(57) ABSTRACT

A dual CPU and its heat dissipating structure are applied to a heat dissipating module installed on a dual-CPU computer device, and CPUs are arranged alternately with each other on a motherboard, and the heat dissipating modules are installed at positions of the CPUs, such that the alternately arranged heat dissipating modules can prevent interferences by external cold air, and a heat source produced by the CPUs can be conducted and dissipated to the outside to prevent the heat source form remaining at the surrounding of the CPUs and related components installed on the motherboard to achieve an excellent heat dissipating efficiency.

5 Claims, 6 Drawing Sheets

DUAL CPU AND HEAT DISSIPATING STRUCTURE THEREOF

BACKGROUND OF THE INVENTION

1. Field of the Invention

The present invention relates to a computer device with a dual central processing unit (CPU) and its heat dissipating structure, and more particularly to those capable of effectively dissipating a heat source produced by a computer device with a dual CPU and preventing the heat source to remain in the CPU and the related electronic components installed on a motherboard, such that heat can discharge to the outside quickly and an excellent heat dissipating efficiency is achieved.

2. Description of the Related Art

As the performance required by applications of an industrial computer becomes increasing higher, Dual CPU single-board computer with a PICMG structure is introduced for specific applications. Many related products available in the market come with the high-performance dual CPU installed on a motherboard, and the heat dissipation issue becomes a major bottleneck for the development of the dual CPU systems.

Since last year, Intel has been announcing a series of chipsets with new architecture, and adopted the architecture of CPU plus Chipset to substitute the past architecture of North Bridge plus South Bridge plus CPU. Intel has integrated both memory and graphic chip into the architecture of the CPU, such that the size of CPU is much larger than those in the past, and the PICMG dual-CPU single-board computer no longer adopts the past design with two parallel adjacent rows anymore, and it uses a 2-in-1 cooler.

With reference to FIG. 1 for a conventional heat dissipating structure of the dual CPU, a plurality of dual CPUs 200 are installed separately on a motherboard 100 and disposed linearly with each other, and each CPU 200 includes a heat dissipating module 300, a fan 400 installed on the heat dissipating module 300. Since the CPUs 200 are aligned on the same straight line in such structure, the space for installing the heat dissipating module 300 becomes smaller, and thus making the installation difficult and inconvenient. Furthermore, cold air is sucked into the same space during the heat dissipation process, and causes interferences and a poor heat dissipation effect.

With reference to FIG. 2 for a schematic view of another conventional apparatus, dual CPUs 200 are arranged adjacent to one another in a row and installed on a motherboard 600, and a continuous heat dissipating module 500 is installed across each CPU 200 to reduce the difficulty of the installation. However, the problem of sucking in cold air from the same surrounding space to cause an interference problem during the heat dissipation process still cannot be overcome, and the CPUs 200 are arranged adjacent to one another, such that the weight of CPU's is concentrated at a certain area of the motherboard 600 to give rise to a non-uniform weight of the motherboard 600, and the heat source will be concentrated at a creation area to cause a poor heat dissipating effect.

SUMMARY OF THE INVENTION

In view of the shortcomings of the prior art, the inventor of the present invention based on years of experience in the related industry to conduct extensive researches and experiments, and finally developed a dual CPU and its heat dissipating structure in accordance with the present invention to overcome the shortcomings of the prior art.

Therefore, it is a primary objective of the invention to provide a heat dissipating structure capable of discharging a heat source produced by the CPUs to the outside effectively.

Another objective of the present invention is to maintain the balance of the motherboard, so as to prevent a thermo-gravimetric problem.

To achieve the foregoing objectives, the present invention adopts the following technical measures and provides a heat dissipating structure comprising a motherboard, a plurality of CPUs disposed alternately with each other on the motherboard and arranged with an interval apart from each other to maintain a specific balance of the motherboard and prevent the thermo-gravimetric problem, and a heat dissipating module disposed on each CPU, wherein the heat dissipating modules are arranged alternately with each other to prevent interferences by external cold air and discharge the heat source produced by the CPUs to the outside. In addition, the interval maintained between adjacent CPUs provides an easier installation and a larger effective heat dissipating area than those of the prior art.

The present invention further comprises a fan installed on a side of the heat dissipating module for blowing external cold air in an extended direction parallel to the motherboard towards the heat dissipating module, a heat dissipating air passage formed in a casing, a plurality of fins orderly arranged in parallel with an air flow direction of the fan in the casing and having a predetermined interval between one another, such that the heat source is restricted by the casing, and shifted in a horizontal direction.

DETAILED DESCRIPTION OF THE PREFERRED EMBODIMENTS

The technical characteristics and effects of the present invention will be apparent with the detailed description of preferred embodiments together with the illustration of related drawings as follows.

Figure 1:
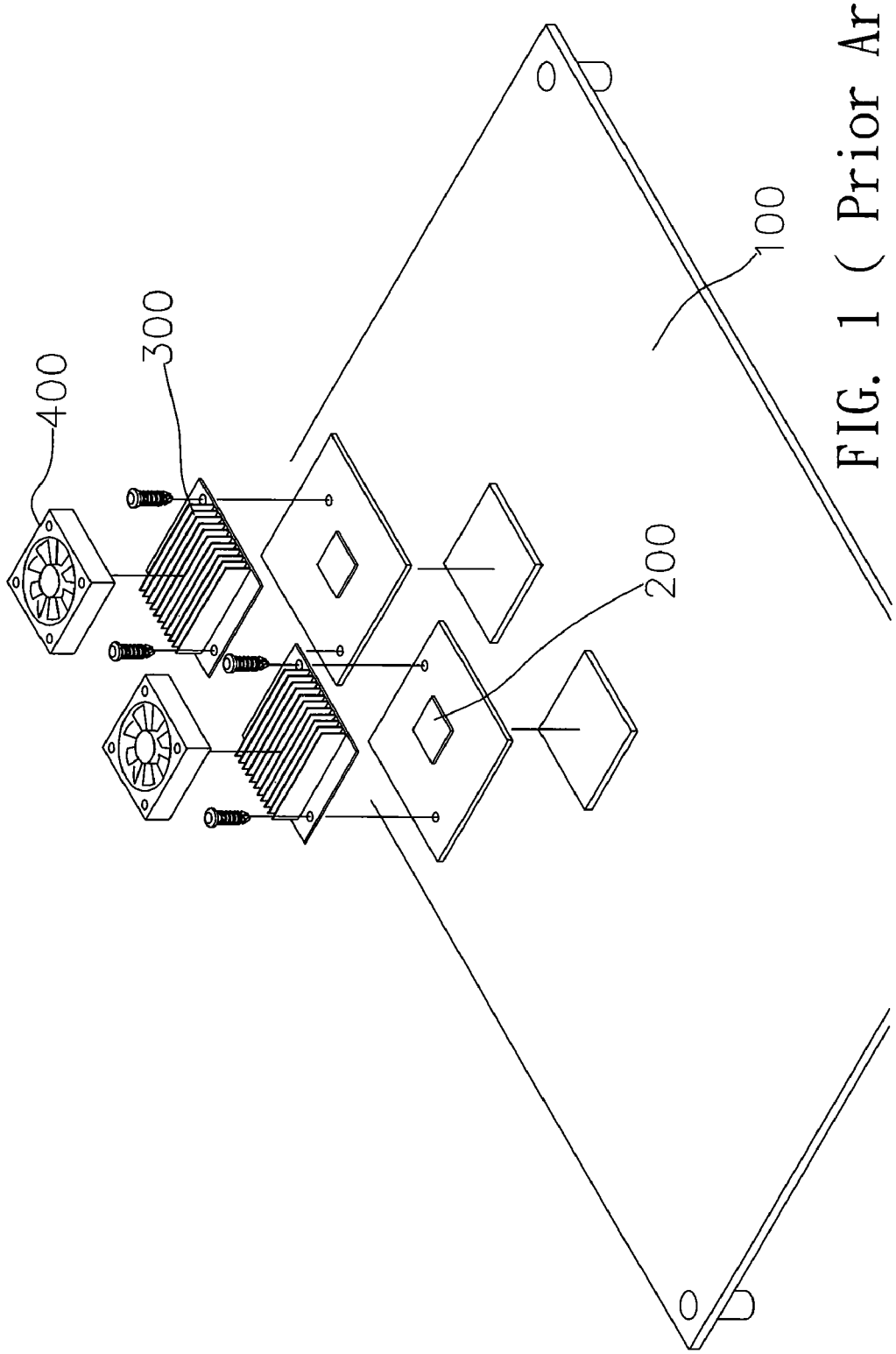
FIG. 1 is a schematic view of a conventional apparatus.
Figure 2:
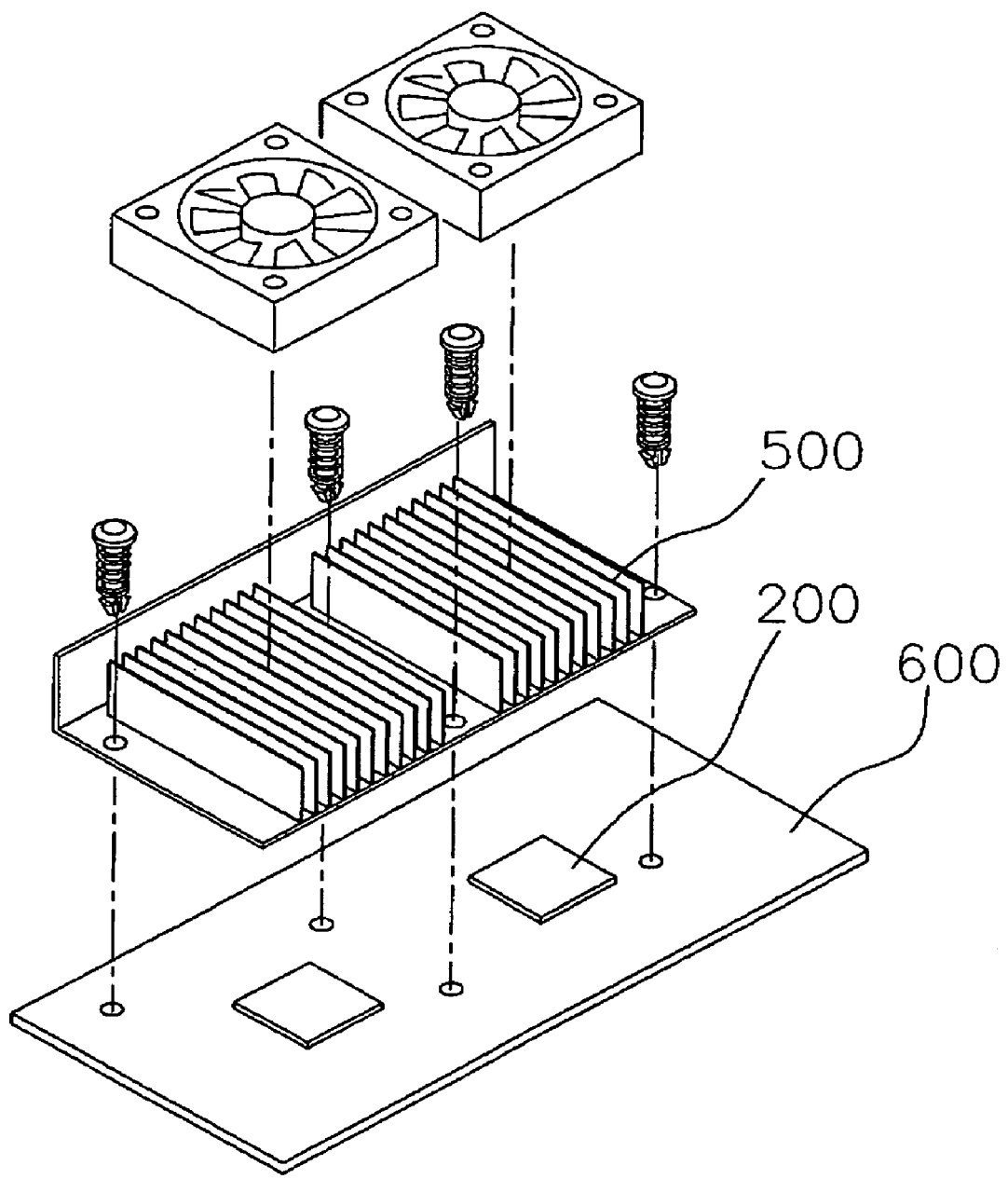
FIG. 2 is a schematic view of another conventional apparatus.
Figure 3:
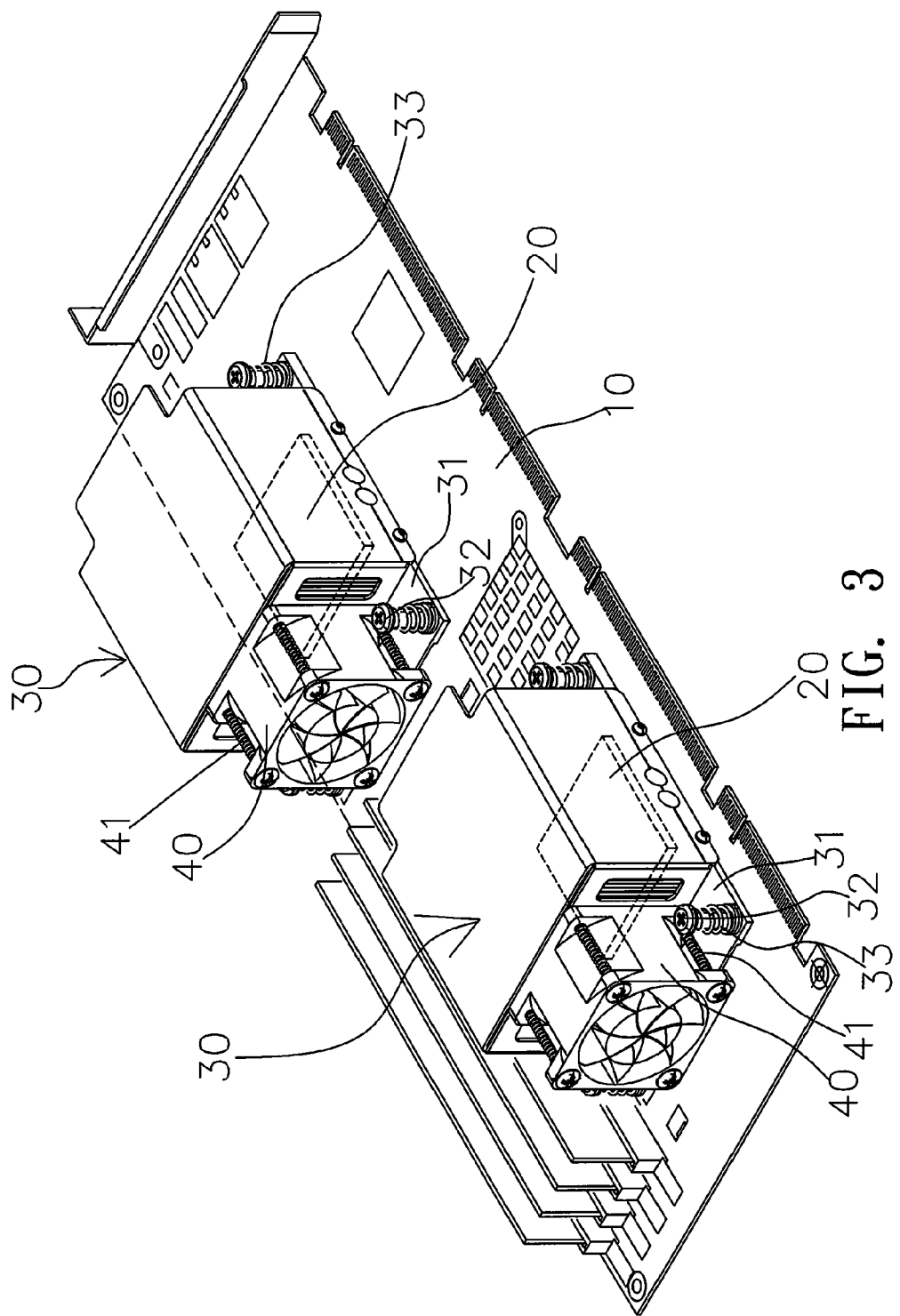
FIG. 3 is a perspective view of the present invention.

With reference to FIGS. 3 to 6 for a dual CPU and its heat dissipating structure of the present invention, the heat dissipating structure comprises a motherboard 10, two CPUs 20 installed alternately with each other on the motherboard 10 and having a specific distance apart from each other, such that the motherboard 10 can be maintained in balance without having a thermo-gravimetric problem at a certain area of the motherboard 10, and each CPU 20 has a heat dissipating module 30 as shown in FIG. 3 (wherein opposite sides of the alternately arranged heat dissipating modules 30 of the present invention have at most ⅔ of the length overlapped, and approximately ⅓ of the lengths of the opposite sides is overlapped in this preferred embodiment).

Each heat dissipating module 30 includes a first bottom plate 31 and a second bottom plate 37; furthermore, a screw rod 32 installed at each end of the first bottom plate, a spring 33 sheathed on the screw rod 32, and a through hole 34 formed on each end of the second bottom plate 37 for sheathing and passing the screw rod 32 correspondingly, wherein a casing 35 is mounted on the first bottom plate 31, and the casing 35 is a hollow frame.

Figure 4:
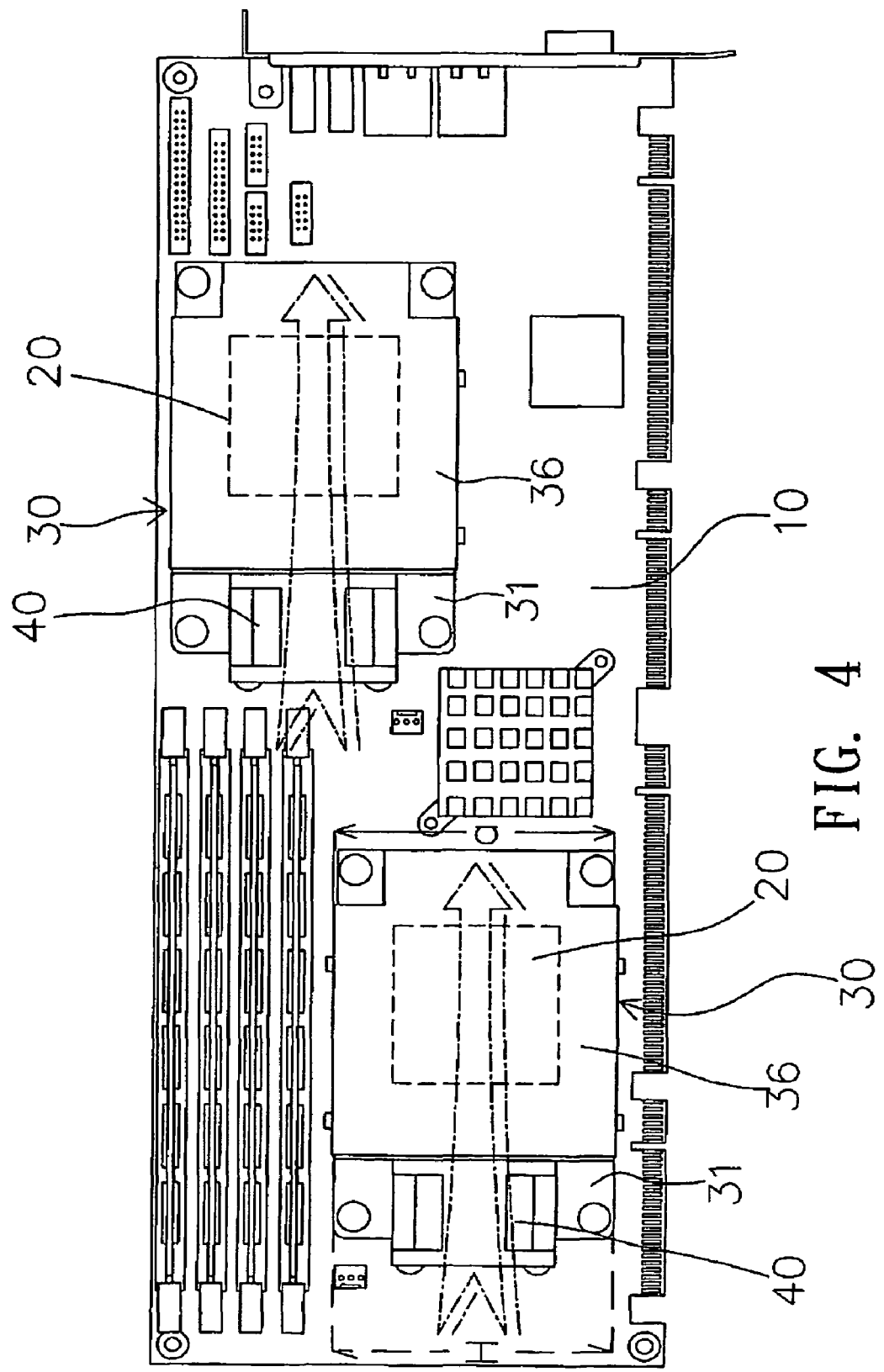
FIG. 4 is a top view showing the operation of the present invention.
Figure 5:
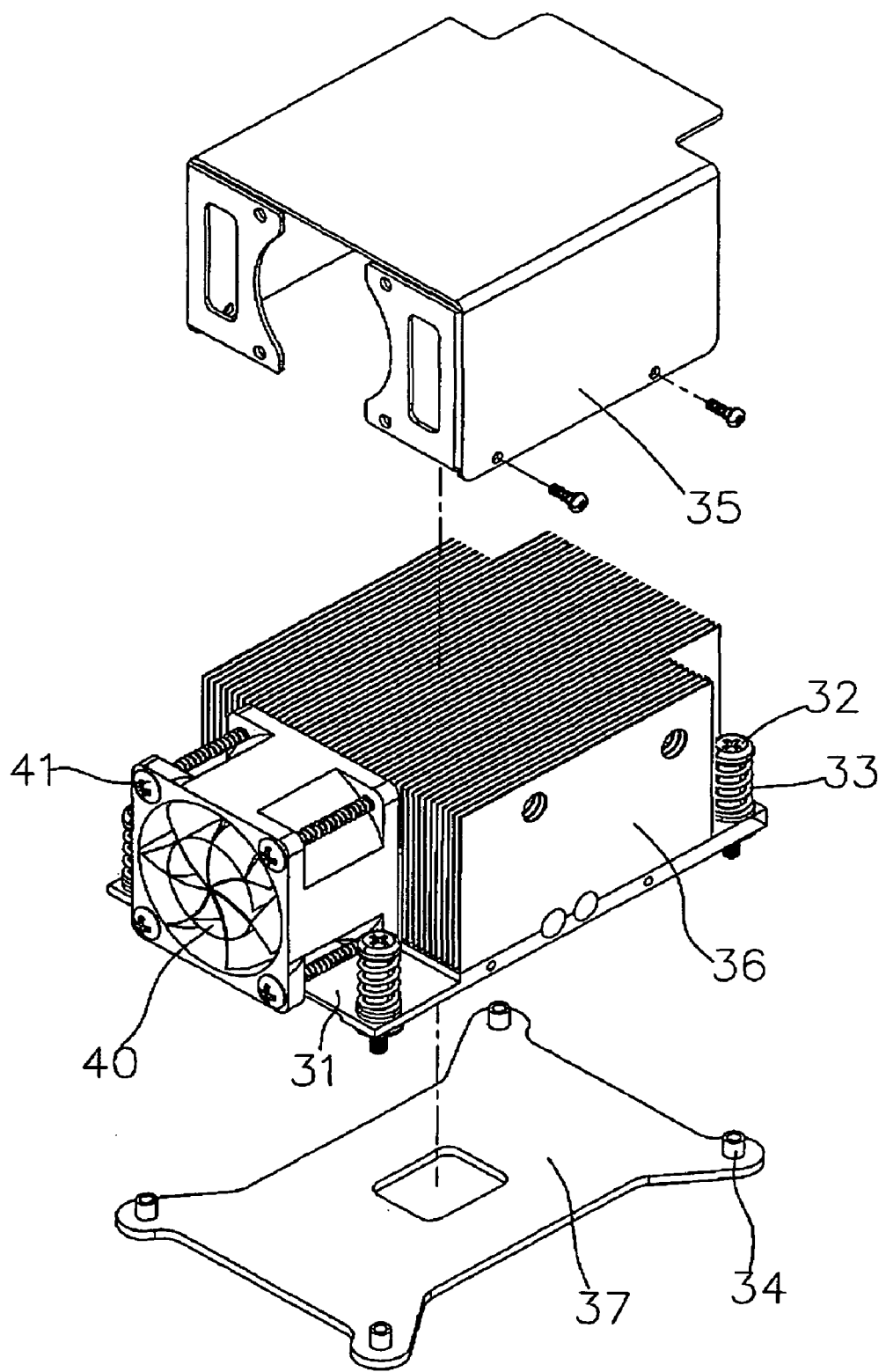
FIG. 5 is an exploded view of a heat dissipating apparatus of the present invention.
Figure 6:
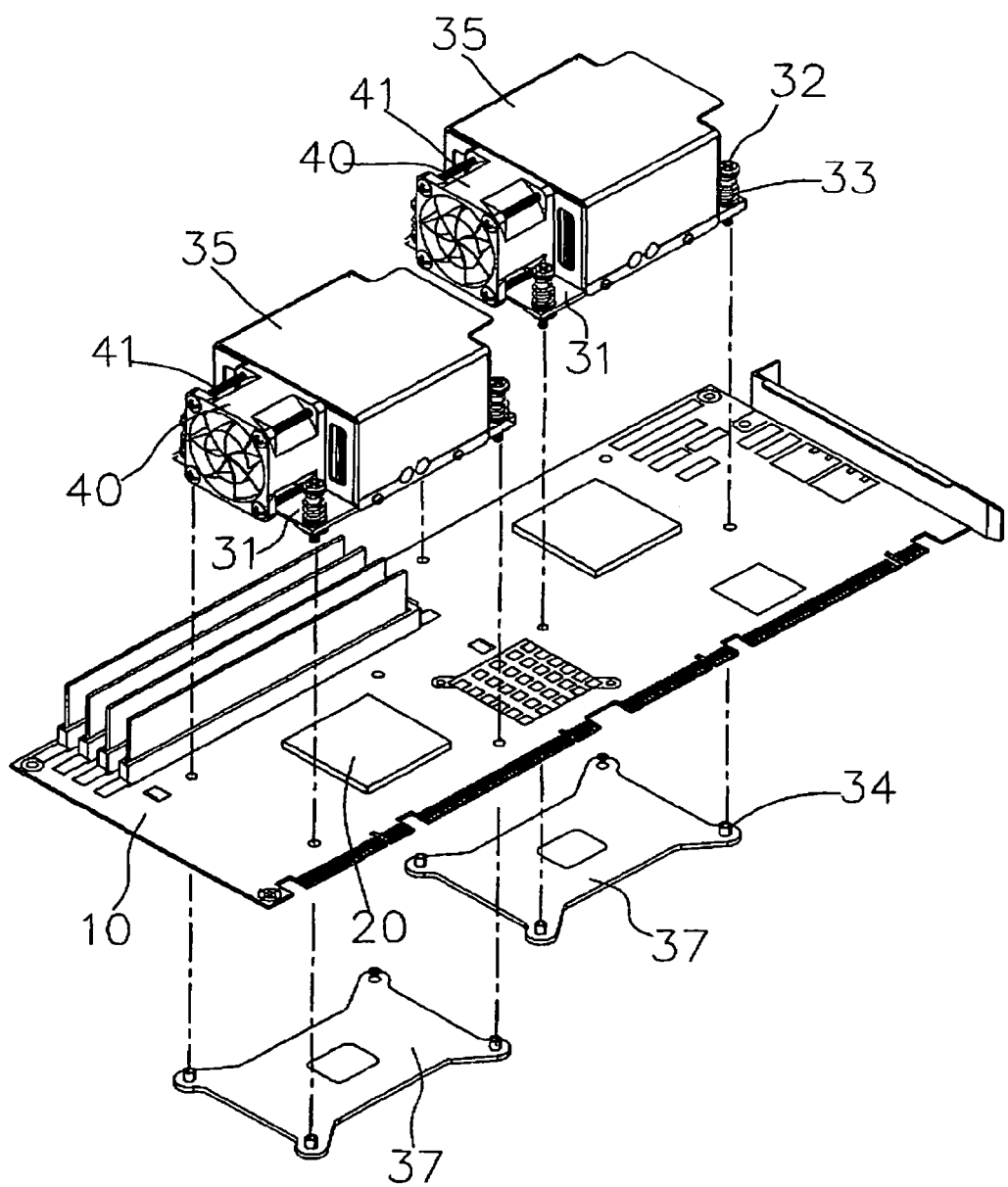
FIG. 6 is an exploded view of a dual CPU and a heat dissipating apparatus of the present invention.

Each casing 35 includes a fan 40 installed on a side of the casing 35 for blowing external cold air in a direction parallel to the motherboard 10 and towards the heat dissipating module 30, and a heat dissipating air passage is formed by the casing 35, and a lock rod 41 is disposed at each edge of the fan 40 and secured onto a surface of the casing 35 (as shown in FIG. 5) and combined with the heat dissipating module 30 (as shown in FIG. 6), and a plurality of orderly arranged fins 36 are installed in the casings 35, wherein the fins 36 are arranged in a direction parallel to the direction of an airflow produced by the fan 40, and an interval is maintained between the fins 36, such that the heat source is restricted by the casing 35 to shift in a horizontal position (as shown in FIG. 4).

In an application as shown in FIGS. 3 and 4, the CPUs 20 are arranged alternately with each other, so that the heat dissipating modules 30 installed on the CPUs 20 are also arranged alternately, and such arrangement not only allows an easy installation, but also prevents interferences between the heat dissipating modules 30, so that the heat can be conducted and dissipated from the fins 36 in the casing 35 to the outside through the air passage of the casing 35. In addition, the fan 40 installed on a side of the heat dissipating module 30 can discharge the heat to the outside quickly.

In summation of the description above, the present invention can overcome the shortcomings of the prior art and complies with the patent application requirements, and thus is duly filed for patent application. While the invention has been described by means of specific embodiments, numerous modifications and variations could be made thereto by those generally skilled in the art without departing from the scope and spirit of the invention set forth in the claims.

What is claimed is:

1. A dual CPU and a heat dissipating structure thereof, installed on a motherboard of a computer, comprising:

two CPUs, installed on the motherboard, and arranged alternately with each other;

two heat dissipating modules, and each of the two heat dissipating modules is installed on the two CPUs respectively, and the two heat dissipating modules are arranged alternately with each other, wherein at most two-thirds of a length of opposite sides of the alternately arranged heat dissipating modules are overlapped, so as to maintain balance of the motherboard and to prevent a thermogravimetric problem; and two heat dissipating fans, and each of the two heat dissipating fans is installed on the same lateral sides of the two heat dissipating modules respectively, for producing an airflow in a direction parallel to the motherboard;

thereby less interference occurs when the alternately arranged heat dissipating modules allow external cold air to enter into the heat dissipating modules, so as to discharge the heat source produced by the two CPUs to the outside of the motherboard quickly to achieve an excellent heat dissipating efficiency.

2. The dual CPU and the heat dissipating structure thereof as cited in claim 1, wherein each of the two heat dissipating modules includes a casing, and a heat dissipating air passage formed by the casing.

3. The dual CPU and the heat dissipating structure thereof as cited in claim 2, wherein the casing includes a plurality of orderly arranged heat dissipating fins.

4. The dual CPU and the heat dissipating structure thereof as cited in claim 3, wherein an interval is maintained between the heat dissipating fins.

5. The dual CPU and the heat dissipating structure thereof as cited in claim 1, wherein each of the heat dissipating modules includes a first bottom plate and a second bottom plate; furthermore, a screw rod installed on each end of the first bottom plate, a spring sheathed on the screw rod, and a through hole formed on each end of the second bottom plate for sheathing and passing the screw rod.

* * * * *